United States Patent
Lee et al.

(10) Patent No.: US 6,847,573 B2
(45) Date of Patent: Jan. 25, 2005

(54) SYNCHRONOUS SRAM-COMPATIBLE MEMORY DEVICE INCLUDING DRAM ARRAY WITH INTERNAL REFRESH

(75) Inventors: Sun Hyoung Lee, Seoul (KR); In Sun Yoo, Icheon-si (KR); Dong Woo Shin, Icheon-si (KR)

(73) Assignee: Silicon7, Inc. (KR)

( * ) Notice: Subject to any disclaimer, the term of this patent is extended or adjusted under 35 U.S.C. 154(b) by 0 days.

(21) Appl. No.: 10/608,719

(22) Filed: Jun. 26, 2003

(65) Prior Publication Data
US 2004/0017714 A1 Jan. 29, 2004

(30) Foreign Application Priority Data
Jul. 24, 2002 (KR) ................. 10-2002-0043480

(51) Int. Cl.[7] .............................. G11C 7/00
(52) U.S. Cl. ............. 365/222; 365/149; 365/191; 365/230.01; 365/233
(58) Field of Search ............. 365/149, 189.01, 365/191, 221, 222, 230.01, 230.08, 233

(56) References Cited

U.S. PATENT DOCUMENTS 5,588,130 A * 12/1996 Fujishima et al. .......... 711/118
RE35,921 E * 10/1998 Harlin et al. ............... 365/233
6,392,958 B1 * 5/2002 Lee ......................... 365/233.5
6,603,704 B2 * 8/2003 Wilson .................. 365/230.08
2003/0198098 A1 * 10/2003 Fujioka et al. ............. 365/200

* cited by examiner

Primary Examiner—Van Thu Nguyen
(74) Attorney, Agent, or Firm—Cantor Colburn LLP

(57) ABSTRACT

The synchronous SRAM-compatible memory includes a DRAM array, a data input/output unit, an address input unit, a burst address generating unit, a state control unit, a refresh timer, and a refresh control unit. The data input/output unit controls input and output of data. The address input unit inputs a row address and a column address. The burst address generating unit generates a sequentially varying burst address. The state control unit generates a burst enable signal that enables the burst address generating unit, controls the data input/output unit, and generates a wait indication signal while an access operation of a previous frame is performed with respect to the memory array. The refresh timer generates a refresh request signal activated at regular intervals. The refresh control unit controls the refresh operation with respect to the DRAM array in response to the refresh request signal.

14 Claims, 7 Drawing Sheets

SYNCHRONOUS SRAM-COMPATIBLE MEMORY DEVICE INCLUDING DRAM ARRAY WITH INTERNAL REFRESH

BACKGROUND OF THE INVENTION

1. Field of the Invention

The present invention relates generally to semiconductor memory devices, and more particularly to a memory device compatible with a synchronous static random access memory (SRAM) and a method of driving the same, in which the synchronous SRAM-compatible memory has dynamic random access memory cells and synchronizes with an external clock signal.

2. Description of the Related Art

As well known to those skilled in the art, a Random Access Memory (RAM), a type of semiconductor memory device, is generally classified into two types of memories, Static RAM (SRAM) and Dynamic RAM (DRAM). A general RAM includes a memory array composed of a plurality of unit memory cells arranged in a matrix form defined by rows and columns, and peripheral circuits adapted to control the input/output of data to/from the unit memory cells. Each of the unit memory cells in an SRAM stores one bit of data and has four transistors that form a latch structure and two transistors that serve as transmission gates. Since a general SRAM stores data in unit memory cells having latch structures, a refresh operation is not required to maintain the stored data. Further, the SRAM has the advantages of a fast operating speed and low power consumption compared to a DRAM.

However, since each unit memory cell of the SRAM is composed of six transistors, the SRAM disadvantageously requires a large wafer area compared to a DRAM in which each unit memory cell is implemented using a transistor and a capacitor. In more detail, in order to manufacture a semiconductor memory device of the same capacity, an SRAM requires a wafer area about six to ten times that of a DRAM. Such a large wafer area increases the unit cost of an SRAM. When a general DRAM instead of an SRAM is used to reduce the cost, a DRAM controller is additionally required to perform a periodic refresh operation. Further, the entire performance of a system is deteriorated due to the time required to perform the refresh operation and a slow operation speed.

In order to overcome the disadvantages of the DRAM and SRAM devices, attempts have been made to implement a SRAM to which DRAM memory cells are applied. One of these attempts is the technology of hiding a refresh operation by constructing a memory with a plurality of DRAM banks and a plurality of SRAM caches, thus making the memory compatible with an SRAM.

However, in the conventional technology, since a column address is continuously changed even though a column address is not received from the outside in the state where a word line for selecting a row of a memory array is kept activated, the burst access operation of inputting/outputting data to/from a specified memory cell cannot be implemented.

SUMMARY OF THE INVENTION

Accordingly, the present invention has been made to overcome or alleviate the above problems occurring in the prior art. The present invention provides a synchronous SRAM-compatible memory and a method for driving the same, in which the memory is compatible with an SRAM even while employing DRAM memory cells, synchronizes with an external clock signal, and can implement a burst access operation.

In an embodiment of the present invention, the synchronous SRAM-compatible memory including a DRAM array composed of a plurality of DRAM cells arranged in a matrix form defined by rows and columns. The DRAM cells require a refresh operation at regular intervals to maintain data stored in the synchronous SRAM-compatible memory. The synchronous SRAM-compatible memory interfaces with an external system for simultaneously providing a row address and a column address. The synchronous SRAM-compatible memory includes the DRAM array; a data input/output unit for controlling input and output of data to/from the DRAM array; an address input unit for inputting a row address and a column address of a current frame in a range where a certain effective address signal is activated, the addresses being effectively input in synchronization with a certain external clock signal; a burst address generating unit for generating a burst address sequentially varying with respect to the column address in synchronization with the external clock signal; a state control unit for generating a burst enable signal that enables the burst address generating unit, controlling the data input/output unit, and generating a wait indication signal of a first logic state while an access operation of a previous frame is performed with respect to the DRAM array, the access operation of the previous frame including a write access operation and a refresh operation before the effective address signal of the current frame is activated; a refresh timer for generating a refresh request signal activated at regular intervals; and a refresh control unit for controlling the refresh operation with respect to the DRAM array in response to the refresh request signal, the refresh operation being performed after completion a the burst access operation ongoing with respect to the DRAM array.

In accordance with the present invention, a method of driving a synchronous SRAM-compatible memory is provided. The method of the synchronous SRAM-compatible memory includes the steps of (A) inputting an effective address signal, in which the row and column addresses of the current frame are effectively input while the effective address signal is activated, and the row and column addresses of the current frame are not effectively input while the effective address signal is inactivated; (B) determining whether an access operation of a previous frame is performed when activation of the effective address signal is detected; (C) waiting for completion of the access operation of the previous frame and generating a wait indication signal of a first logic state to provide the wait indication signal to an outside when it is determined that the access operation of the previous frame is performed in the step (B); and (D) performing a burst access operation in which a burst address for selecting a column of the DRAM memory array is varied in synchronization with an external clock signal when it is determined that the access operation of the previous frame is completed in the step (B). The access operation of the previous frame includes a write access operation and a refresh operation generated before the effective address signal of the current frame is activated.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
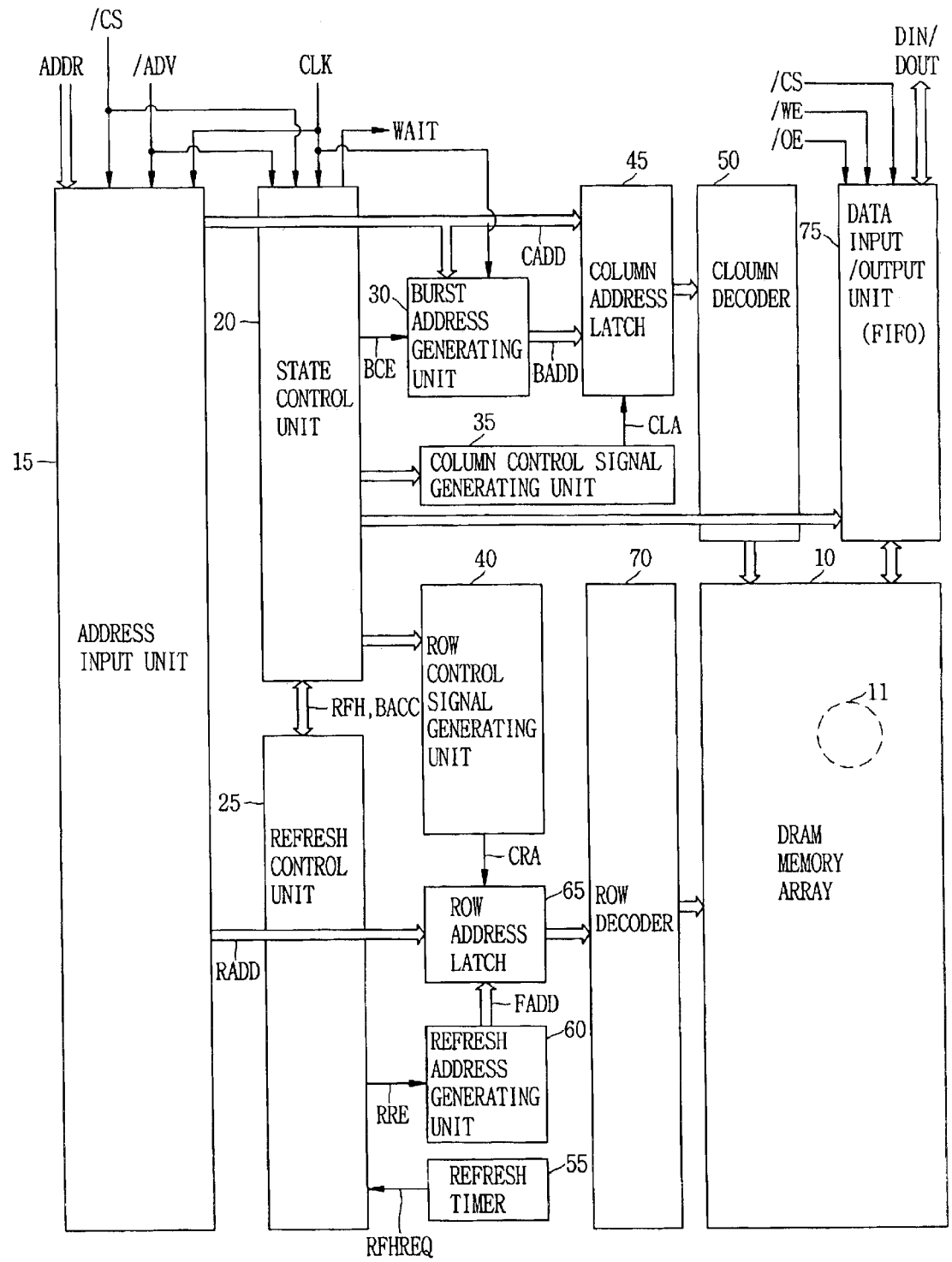
FIG. 1 is a block diagram illustrating a synchronous SRAM-compatible memory according to an embodiment of the present invention.

Reference now should be made to the drawings, in which the same reference numerals are used throughout the different drawings to designate the same or equivalent components.

A synchronous SRAM-compatible memory according to the present invention employs DRAM cells and performs a refresh operation in its internal operation standpoint, but does not allocate an operational period to the refresh operation in its external operation standpoint. Additionally, the synchronous SRAM-compatible memory does not require an external control signal for controlling a refresh operation, and can be operated as does a general synchronous SRAM in its external operation standpoint.

The operations of the synchronous SRAM-compatible memory of the present invention are described in brief below.

The synchronous SRAM-compatible memory has a refresh state. In the refresh state, a refresh operation is performed for activating a selected word line, outputting data from all DRAM cells connected to the word line, amplifying the data and writing the amplified data into the DRAM cells.

The synchronous SRAM-compatible memory has a refresh request state. In the refresh request state, a change of the current state to the refresh state has been requested, but a refresh operation is not performed yet. That is, a refresh request signal provided from a refresh timer has been activated, but the refresh operation is not performed with respect to the DRAM memory array.

The synchronous SRAM-compatible memory has a burst access state. In the burst access state, while a word line is activated, two or more different columns are continuously selected and data is continuously read and written even though no external address is input. Accordingly, in the burst access operation, second and later accesses do not require the activation of the word line.

The synchronous SRAM-compatible memory has a burst reserved state. The burst reserved state denotes the state in which the burst access state has been requested, but the burst access operation is not performed yet.

The synchronous SRAM-compatible memory has an idle state. In the idle state, power is supplied to the synchronous SRAM-compatible memory, but the chip enable signal is inactivated and the chip is disabled.

FIG. 1 is a block diagram illustrating a synchronous SRAM-compatible memory according to an embodiment of the present invention. The synchronous SRAM-compatible memory of the embodiment includes a DRAM memory array 10, an address input unit 15, a state control unit 20, a refresh control unit 25, a burst address generating unit 30, a refresh timer 55 and a data input/output unit 75.

Figure 2:
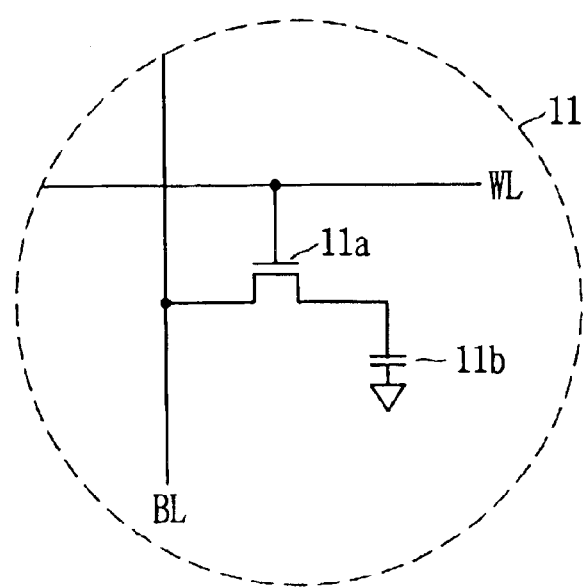
FIG. 2 is a diagram showing a memory cell included in a DRAM memory array of FIG. 1.

The DRAM memory array 10 includes a plurality of memory cells 11 arranged in a matrix form defined by rows and columns. The memory cells 11 require a refresh operation at certain intervals to maintain stored data. A typical example of such a memory cell 11 is a DRAM cell. Accordingly, for ease of description, the memory cell 11 may be referred to as a "DRAM cell" in the present specification. The DRAM cell, as shown in FIG. 2, is implemented using a transmission transistor 11a gated by a word line WL and a capacitor 11b adapted to store data of a bit line BL transmitted through the transmission transistor 11a.

The address input unit 15 effectively receives an external address ADDR in synchronization with an external clock signal CLK in the range where a chip enable signal /CS and a certain effective address signal /ADV are activated to be, for example, "LOW". That is, in the range where the effective address signal /ADV is "HIGH," the external address ADDR is not effectively input to the address input unit 15. The chip enable signal /CS is the signal that enables the synchronous SRAM-compatible memory, and is generally provided from the outside. The synchronous SRAM-compatible memory receives a row address RADD and a column address CADD at the same time, like a general SRAM. In the present specification, the row address RADD and the column address CADD may be generally referred to as an "external address ADDR."

The state control unit 20 controls the overall operation of the synchronous SRAM-compatible memory. For example, even though the effective address signal /ADV is activated from the outside and, therefore, a request for the performance of a burst access operation is raised, the state control unit 20 controls the synchronous SRAM-compatible memory to wait until an ongoing write access operation of a previous frame is terminated, if the write access operation of the previous frame is performed or a column latency operation for the write access operation is ongoing. Additionally, in the case where a refresh operation of a previous frame is ongoing, the state control unit 20 controls the synchronous SRAM-compatible memory to wait until the ongoing refresh operation is terminated. When the write operation or refresh operation of the previous frame is terminated, the synchronous SRAM-compatible memory performs the burst access operation. For ease of description, the write access operation of the previous frame and the refresh operation of the previous frame are generally referred to as "the access operation of the previous frame."

The state control unit 20 is described in more detail below.

The state control unit 20 receives a chip enable signal /CS and an effective address signal /ADV, and controls the operational state of the synchronous SRAM-compatible memory while communicating with the refresh control unit 25. The state control unit 20 provides a certain wait indication signal WAIT to an external system. The wait indication signal WAIT is the signal indicating that the synchronous SRAM-compatible memory can effectively output data. In the present specification, for example, when the wait indication signal WAIT is "HIGH," data can be effectively output to the outside.

In the range where the DRAM memory array 10 is being refreshed or a word line having been activated is not inactivated yet, the wait indication signal WAIT is "LOW" and, therefore, data cannot be effectively output. Additionally, the wait indication signal WAIT also becomes "LOW" in the range that is required to internally activate a specified word line in the synchronous SRAM-compatible memory. For example, in the read operation of the synchronous SRAM-compatible memory, the wait indication signal WAIT becomes "LOW" in the range of a certain column latency operation (in the present specification, referred to as a "first logic state"). Additionally, the state control unit 20 controls the data input/output unit 75.

Also, the state control unit 20 controls a refresh operation to be performed after the performance of the write access operation or burst access operation is completed, with respect to a refresh request that is raised while the synchronous SRAM-compatible memory performs the write access operation or burst access operation of the previous frame.

Additionally, the state control unit 20 provides a burst address enable signal BCE to enable the burst address generating unit 30. When the synchronous SRAM-compatible memory sets to a burst access operation, the burst address enable signal BCE is activated to be, for example, "HIGH".

The burst address generating unit 30 is enabled in response to the activation of the burst address enable signal BCE and generates a burst address BADD that is sequentially increased with respect to the column address CADD input from the outside. The increase of the burst address BADD is implemented in synchronization with the external clock signal CLK.

A column address latch 45 selectively latches the column address CADD provided from the address input unit 15 and the burst address BADD in response to a certain column control signal CLA. The column address CADD or the burst address BADD latched by the column address latch 45 is provided to a column decoder 50.

A column control signal generating unit 35 generates the column control signal CLA, which is activated when the synchronous SRAM-compatible memory sets to the burst access operation, while communicating with the state control unit 20.

The column decoder 50 decodes the provided column address CADD or burst address BADD to designate a corresponding column of the DRAM memory array 10.

The refresh timer 55 provides a refresh request signal RFHREQ activated at certain intervals to the refresh control unit 25.

The refresh control unit 25 controls the operation of refreshing the DRAM memory array 10 to be performed in response to the activation of the refresh request signal RFHREQ. However, while the write access operation or burst access operation of the previous frame is performed with respect to the DRAM memory array 10, the performance of the refresh operation is delayed until the write access operation or burst access operation of the previous frame is completed even though the refresh request signal RFHREQ is activated. After the write access operation or burst access operation of the previous frame is completed, the delayed refresh operation is performed.

The refresh control unit 25 controls the refresh operation with respect to the DRAM memory array 10 while communicating with the state control unit 20. That is, the refresh control unit 25 receives a burst access signal BACC indicating whether the synchronous SRAM-compatible memory performs the write access operation or burst access operation of the previous frame or not. Further, the refresh control unit 25 provides the state control unit 20 with a refresh indication signal RFH indicating whether a refresh operation is performed with respect to the DRAM memory array 10 or not.

Additionally, the refresh control unit 25 provides a refresh address control signal RRE to control the refresh address generating unit 30. The refresh control signal RRE is generated in the form of a pulse when the synchronous SRAM-compatible memory sets to the refresh operation.

The refresh address generating unit 30 generates a refresh address FADD to specify a row of the DRAM memory array 10, in response to the rising end of the refresh address control signal RRE.

A row address latch 65 selectively latches the row address RADD provided from the address input unit 15 or the refresh address FADD in response to a certain row control signal CRA. The row address RADD or the refresh address FADD latched by the row address latch 65 is provided to a row decoder 70.

A row control signal generating unit 40 generates the row control signal CRA, which is activated when the synchronous SRAM-compatible memory sets to the refresh operation, while communicating with the state control unit 20.

The row decoder 70 decodes the provided row address RADD or refresh address FADD to designate a corresponding row of the DRAM memory array 10.

When the wait indication signal WAIT is "HIGH," the data input/output unit 75 can effectively provide output data DOUT to the external system in synchronization with the external clock signal CLK.

Additionally, the data input/output unit 75 receives input data DIN in synchronization with the external clock signal CLK. The input data DIN input to the data input/output unit 75 is provided to and written into the DRAM memory array 10. However, while an access operation of a previous frame is performed, the writing of the input data in the DRAM memory array 10 is delayed.

In more detail, the data input/output unit 75 temporarily stores input data DIN, which is received while the access operation of the previous frame is performed, in a buffer contained therein, and writes the received input data DIN in the DRAM memory array 10 after the access operation of the previous frame is terminated.

Preferably, the data input/output unit 75 contains a First-In First-Out (FIFO) buffer therein, and first writes input data first received from the outside in the DRAM memory array 10.

Figure 3:
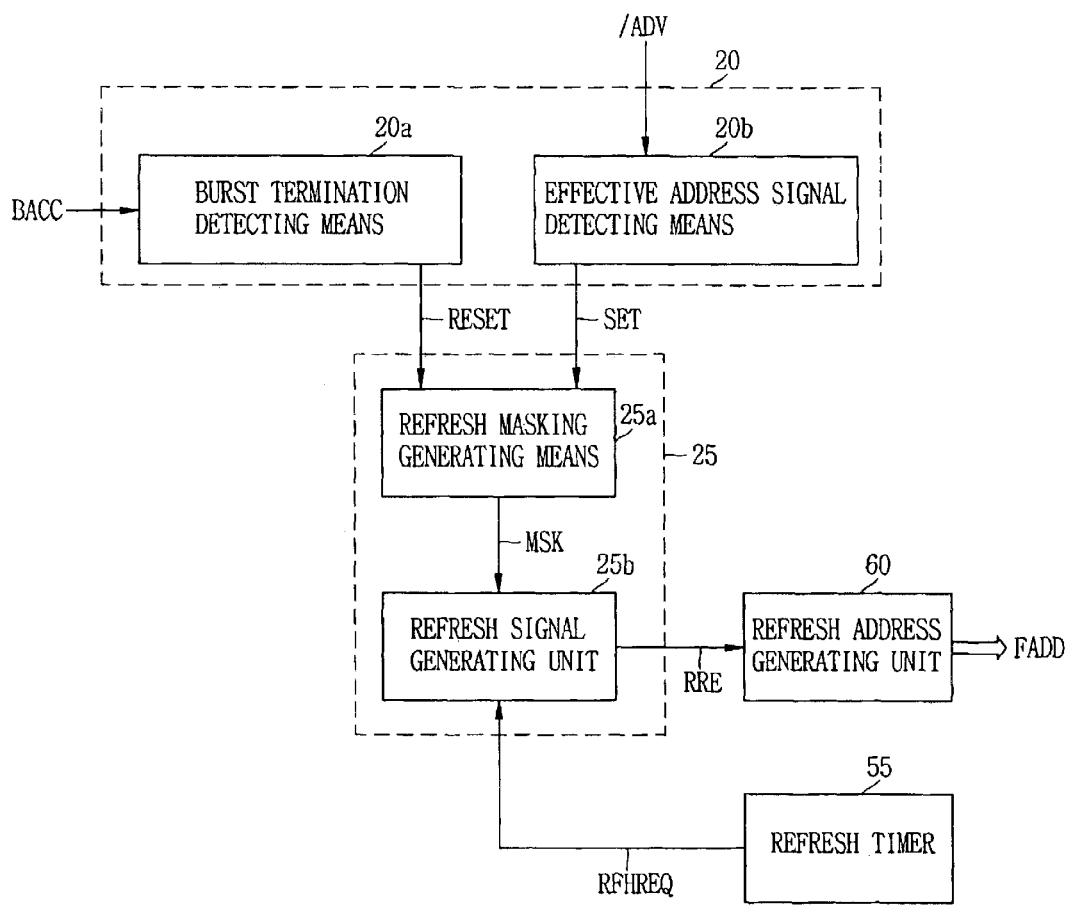
FIG. 3 is a diagram showing an interoperation of a state control unit and a refresh control unit shown in FIG. 1.

FIG. 3 is a diagram illustrating the interoperation of the state control unit 20 and the refresh control unit 25 shown in FIG. 1, in detail. The state control unit 20 includes a burst termination detecting means 20a and an effective address signal detecting means 20b. The refresh control unit 25 includes a refresh masking generating means 25a and a refresh signal generating unit 25b.

The effective address signal detecting means 20b detects the activation end of the effective address signal /ADV and activates a certain setting signal SET. The setting signal SET activates a masking signal MSK by controlling the refresh masking generating means 25a. The activated masking signal MSK controls the refresh signal generating means 25b so that a refresh drive signal RRE for driving the refresh address generating unit 60 is not activated even though the refresh request signal RFHREQ provided from the refresh timer 55 is activated.

When the burst access operation is terminated, the burst termination detecting means 20a activates a certain reset signal RESET in response to the burst access signal BACC inactivated to be "LOW." The activated reset signal RESET disables the masking signal MSK by controlling the refresh masking generating means 25a. Accordingly, when the refresh request signal RFHREQ provided from the refresh timer 55 is activated, the refresh address control signal RRE for driving the refresh address generating unit 60 is activated. Thereafter, the refresh address generating unit 60 is driven and generates the refresh address FADD.

Figure 4:
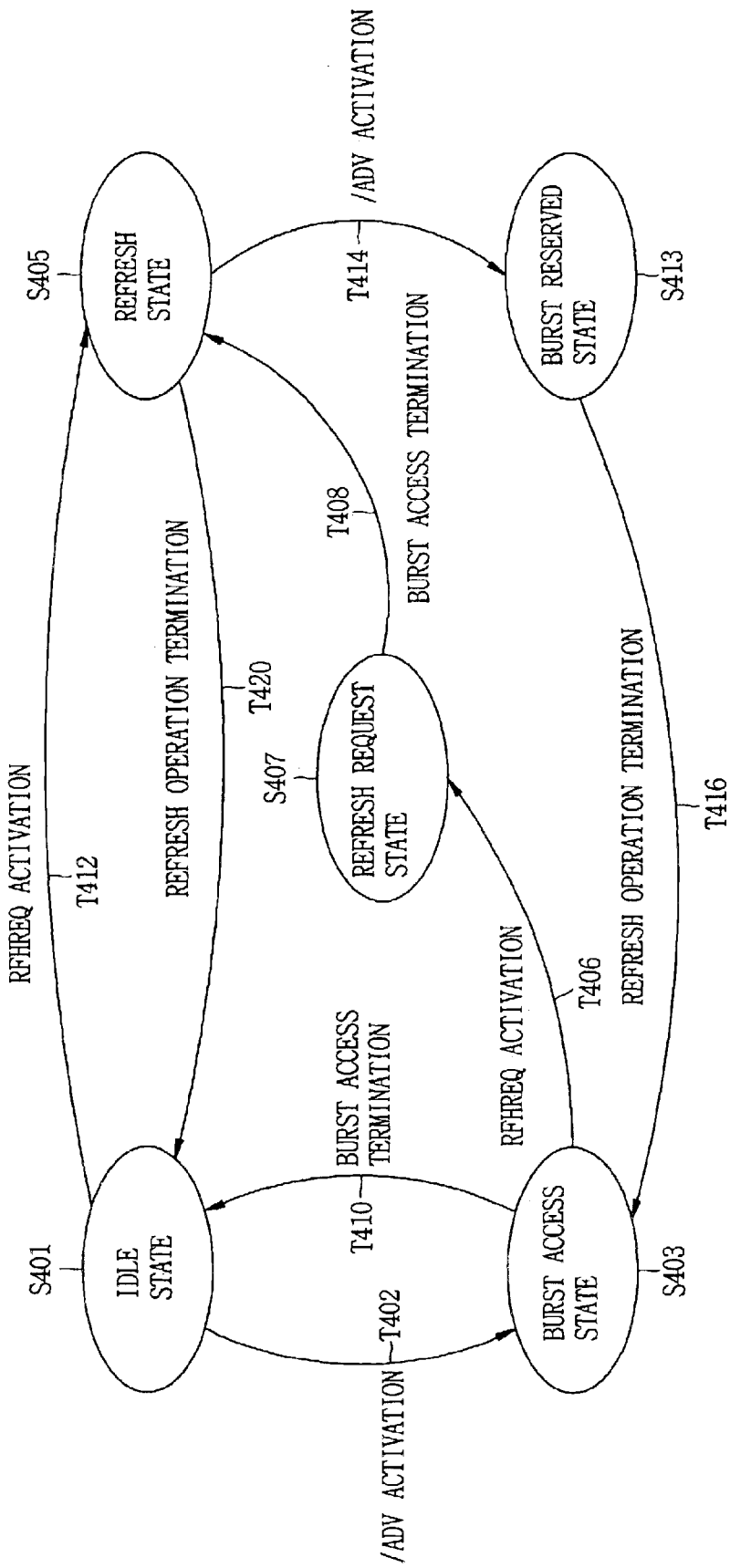
FIG. 4 is a state diagram showing state changes of the synchronous SRAM-compatible memory according to an embodiment of the present invention.

FIG. 4 is a state diagram showing the state changes of the synchronous SRAM-compatible memory according to an embodiment of the present invention. In the state changes, when the chip enable signal /CS is activated, the change of an idle state S401 to another state is possible. Also, when the chip enable signal /CS is inactivated, the synchronous SRAM-compatible memory returns from any of the remaining states to the idle state.

The state changes of the synchronous SRAM-compatible memory are described in detail below. When the effective address signal /ADV is activated to be "LOW" in an idle state S401, the synchronous SRAM-compatible memory receives the external address ADDR in synchronization with the external address ADDR and enters a burst access state S403 (T402). When the refresh request signal RFHREQ is activated in the burst access state S403, the synchronous SRAM-compatible memory enters a refresh request state S407, and waits until the burst access operation is terminated (T406). After the burst access operation is terminated, the synchronous SRAM-compatible memory enters a refresh state S405 and a refresh operation is performed (T408).

However, if the burst access operation is terminated without the activation of the refresh request signal RFHREQ from the burst access state S403, the synchronous SRAM-compatible memory enters the idle state S401 (T410).

When the refresh request signal RFHREQ is activated in the idle state S401, the synchronous SRAM-compatible memory enters the refresh state S405 and performs a refresh operation (T412). When the effective address signal /ADV is activated to be "LOW" in the refresh state S405, the synchronous SRAM-compatible memory enters a burst reserved state S413 and waits until the refresh operation is terminated (T414). After the refresh operation is terminated, the synchronous SRAM-compatible memory enters the burst access state S403 and a burst access operation is performed (T416). However, when the refresh operation is terminated without the activation of the effective address signal /ADV in the refresh state S405, the synchronous SRAM-compatible memory enters the idle state S401 (T420).

The state diagram of FIG. 4 illustrates the state changes mainly in view of the burst access state and the refresh state. However, the burst access state or the refresh state may be replaced with a read/write access state in the diagram. Accordingly, state changes between the read/write access state and the refresh state or state changes between read/write access state and the burst access state can be easily understood by those skilled in the art.

Figure 5:
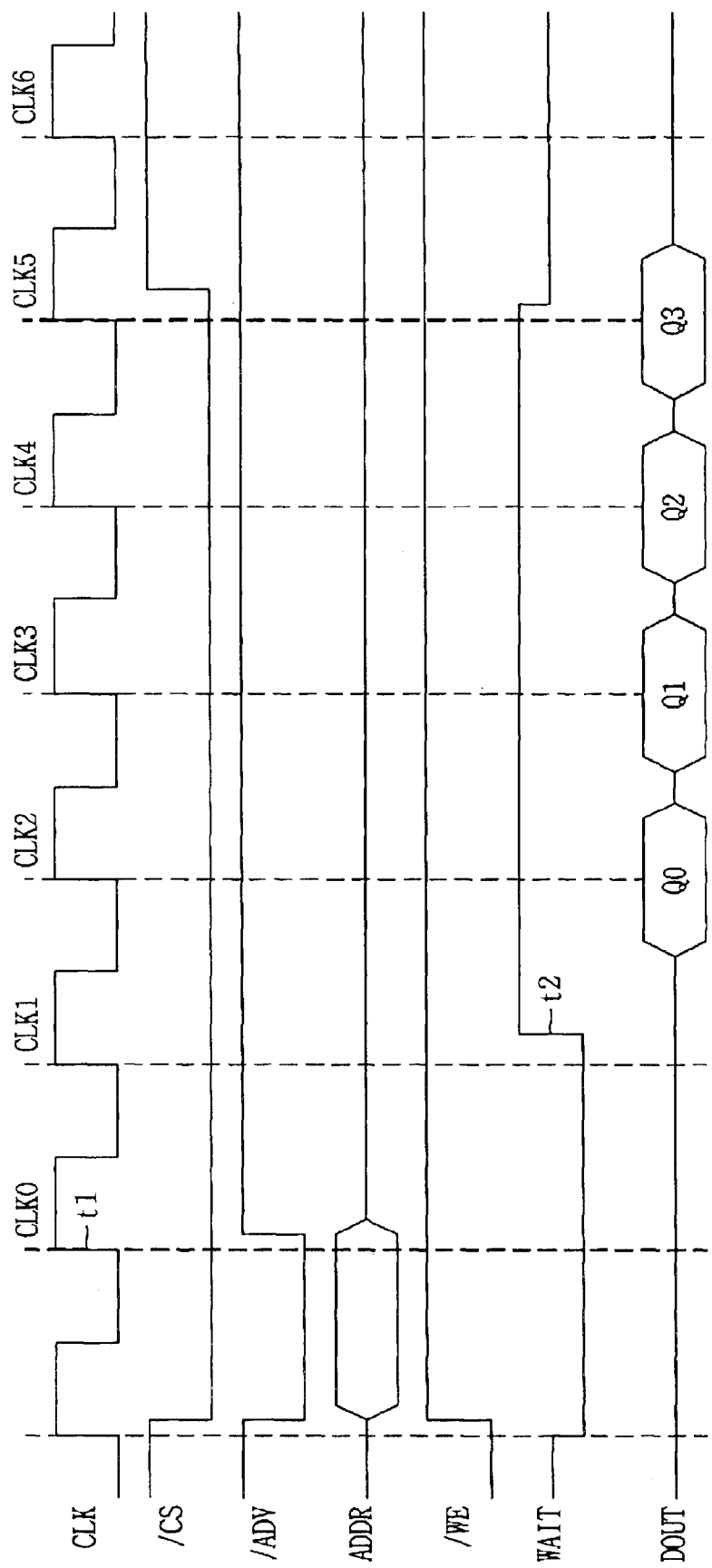
FIG. 5 is a timing chart showing a read operation of the burst access operation of the synchronous SRAM-compatible memory according to the embodiment, in which a column latency is not lengthened.

FIG. 5 is a timing chart showing a read operation of the burst access operation of the synchronous SRAM-compatible memory, in which a column latency is not lengthened. The read operation of FIG. 5 has a burst length of "4." Referring to FIG. 5, a write enable signal /WE is "HIGH." A chip enable signal /CS is activated to be "LOW" at the generation time t1 of clock pulse CLK0, and an effective address signal /ADV is activated to be "LOW" for one clock cycle. At this time, an input address ADDR is effectively input.

However, the wait indication signal WAIT is kept "LOW" until clock pulse CLK1 is generated, which indicates that effective data cannot be output. That is, in the read operation of the synchronous SRAM-compatible memory, the wait indication signal WAIT is kept "LOW" in the range of a column latency range.

The wait indication signal WAIT becomes "HIGH" at time t2 after the rise of pulse CLK1, which indicates that data can be effectively output. Thus, four output data DOUT can be continuously and effectively output in response to clock pulses CLK2 to CLK5.

In the read operation of FIG. 5, since the wait indication signal WAIT is "LOW" when the effective address signal /ADV is activated, the column latency is a minimum value of "1."

Figure 6:
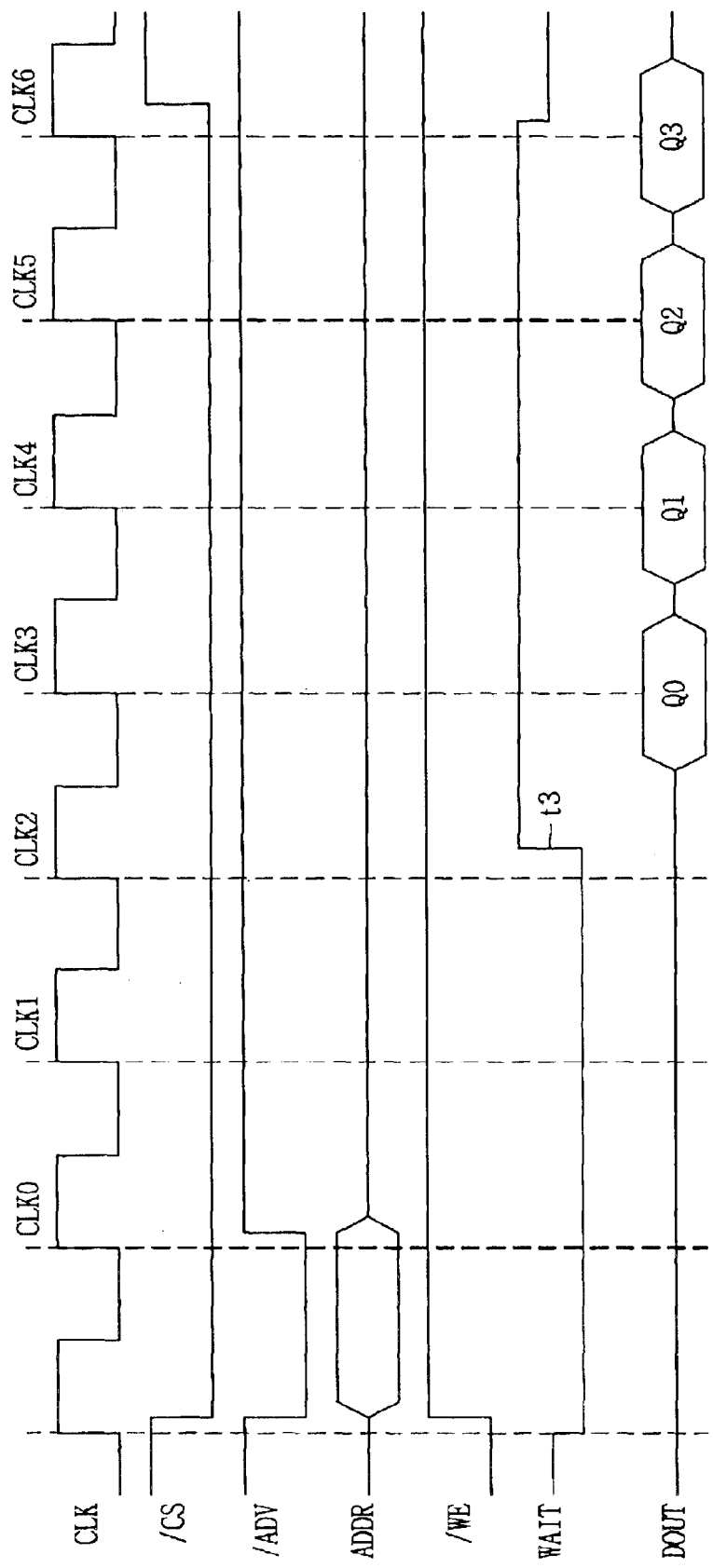
FIG. 6 is a timing chart showing a read operation of the burst access operation of the synchronous SRAM-compatible memory according to the embodiment, in which a column latency is lengthened by one clock cycle.

FIG. 6 is a timing chart showing a read operation of the burst access operation of the synchronous SRAM-compatible memory, in which the column latency is lengthened by one clock cycle.

Comparing the timing chart of FIG. 6 with the timing chart of FIG. 5, when the effective address signal /ADV is activated to be "LOW", the access operation of a previous frame is performed, so that the start of the burst access operation is delayed by one clock cycle. Accordingly, the column latency in this read operation is lengthened by one clock cycle to become "2" and time t3 when the wait indication signal WAIT becomes "HIGH" falls after the generation of clock pulse CLK2. Accordingly, the wait indication signal WAIT is kept "LOW" till the rise of pulse CLK2, which indicates that effective data cannot be output. The four output data DOUT are continuously and effectively output in response to clock pulses CLK3 to CLK6.

Figure 7:
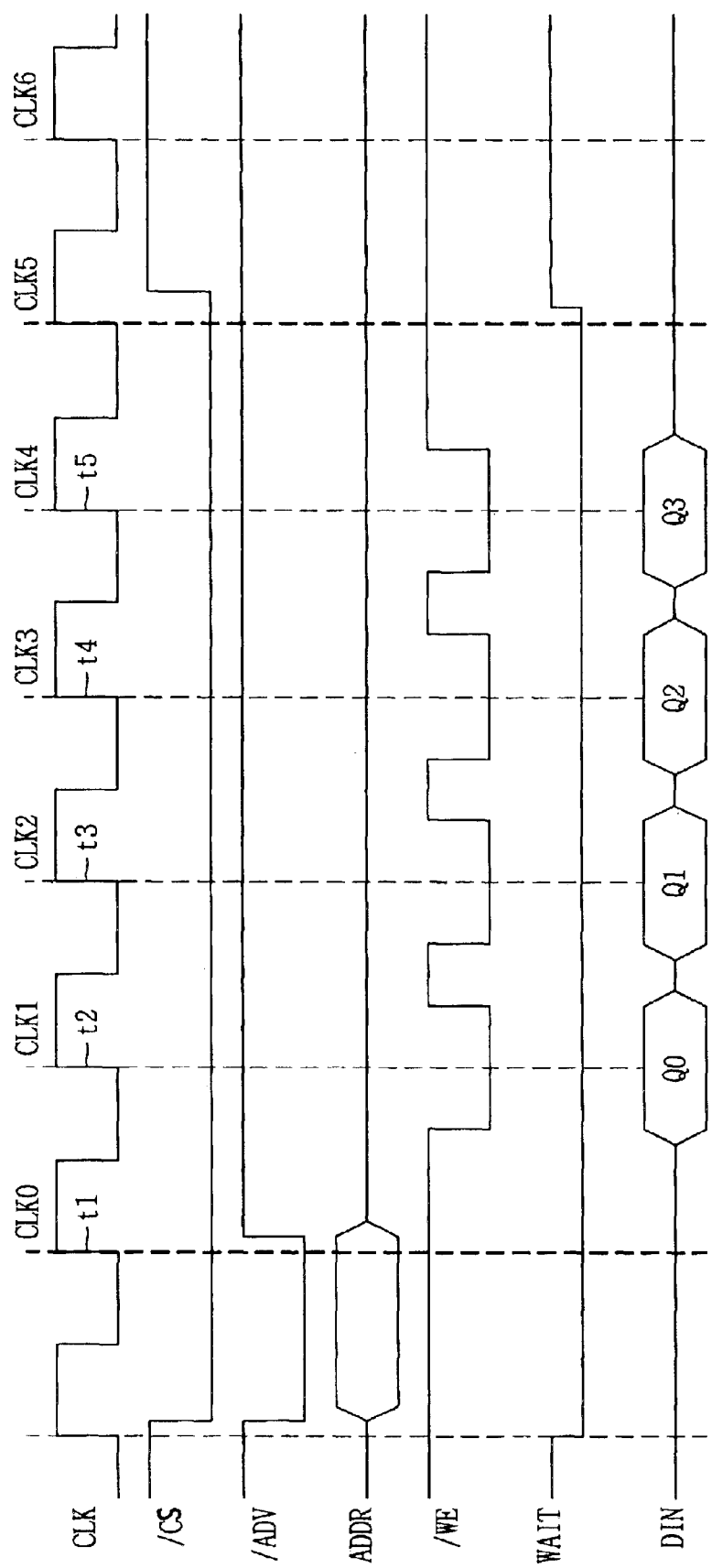
FIG. 7 is a timing chart showing a write operation of the burst access operation of the synchronous SRAM-compatible memory according to the embodiment.

FIG. 7 is a timing chart showing a write operation of the burst access operation of the synchronous SRAM-compatible memory. The write operation of FIG. 7 has a burst length of "4". Referring to FIG. 7, a chip enable signal /CS is activated to be "LOW" at the generation time t1 of clock pulse CLK0, and an effective address signal /ADV is activated to be "LOW" for one clock cycle. At this time, an input address ADDR is effectively input. A write enable signal /WE is activated to be "LOW" at activation times t2, t3, t4 and t5 of clock pulses CLK1, CLK2, CLK3 and CLK4, respectively, of an external clock signal CLK, and at these times, external input data DIN are effectively input.

In the synchronous SRAM-compatible memory, the external input data DIN can be effectively received independent of the logic states of the wait indication signal WAIT. However, while the access operation of a previous frame is performed at current time, the write of the received input data into the DRAM memory array 10 (see FIG. 2) is performed after the access operation of the previous frame is terminated. In contrast, when the access operation of the previous frame is not performed, the writing of the received input data into the DRAM memory array 10 is immediately performed. Accordingly, the write operation is performed in the synchronous SRAM-compatible memory without delay when seen from an external standpoint.

In accordance with the synchronous SRAM-compatible memory and method of driving the same, the synchronous SRAM-compatible memory has dynamic random access memory cells, is compatible with a static random access memory synchronizing with external clock signals, and can implement the burst access operation in synchronization with external clock signals.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A synchronous SRAM-compatible memory having a DRAM array with a plurality of DRAM cells arranged in a matrix from defined by rows and columns, and interfacing with an external system for providing a row address and a column address, the DRAM cells requiring a refresh operation at selected intervals to maintain data stored therein, comprising:

a data input/output unit for controlling input and output of data to/from the DRAM array;

an address input unit for inputting a row address and a column address of a current frame in synchronization with an external clock signal when an effective address signal is activated;

a burst address generating unit for generating a burst address sequentially varying with respect to the column address in synchronization with the external clock signal;

a state control unit for generating a burst enable signal that enables the burst address generating unit, controlling the data input/output unit, and generating a wait indication signal of a first logic state while an access operation of a previous frame is performed with respect to the DRAM array, the access operation of the previous frame including a write access operation or a refresh operation before the effective address signal of the current frame is activated;

a refresh timer for generating a refresh request signal activated at selected intervals; and a refresh control unit for controlling the refresh operation with respect to the DRAM array in response to the refresh request signal, the refresh operation being performed after completion of a burst access operation ongoing with respect to the DRAM memory array.

2. The synchronous SRAM-compatible memory as set forth in claim 1, wherein the wait indication signal has the first logic state while an operation of a column latency is performed.

3. The synchronous SRAM-compatible memory as set forth in claim 1, wherein the refresh control unit further comprises a refresh driving signal generating unit for activating a refresh driving signal for initiating the refresh operation with respect to the DRAM array in response to the refresh request signal, the activation of the refresh driving signal being suppressed by activation of a refresh masking signal.

4. The synchronous SRAM-compatible memory as set forth in claim 3, wherein the refresh control unit further comprises a refresh masking generating unit for generating the refresh masking signal, the refresh masking signal being enabled in response to an effective address signal and being disabled in response to completion of the burst access operation.

5. The synchronous SRAM-compatible memory as set forth in claim 4, wherein the state control unit comprises:

an effective address signal detecting means for detecting activation end of the effective address signal; and a burst termination detector for detecting termination of the burst access operation.

6. The synchronous SRAM-compatible memory as set forth in claim 1, wherein the data input/output unit receives and stores input data provided from an outside in synchronization with the external clock signal and writes the stored input data in the DRAM array, the writing of the stored input data being delayed till completion of the access operation of the previous frame while the access operation of the previous frame is performed.

7. The synchronous SRAM-compatible memory as set forth in claim 6, wherein the data input/output unit further comprises a First-In First-Out (FIFO) buffer for storing the received input data and writing the received input data in the DRAM array, the received input data being written in the DRAM array in a same order of reception.

8. A method of driving a synchronous SRAM-compatible memory having a DRAM array with a plurality of DRAM cells arranged in a matrix form defined by rows and columns, and interfacing with an external system for providing a row address and a column address, the DRAM cells requiring a refresh operation at selected intervals to maintain data stored therein, comprising:

(A) inputting an effective address signal, wherein the row and column addresses of a current frame are effectively input while the effective address signal is activated, and the row and column addresses of the current frame are not effectively input while the effective address signal is inactivated;

(B) determining whether an access operation of a previous frame is performed when activation of the effective address signal is detected;

(C) waiting for completion of the access operation of the previous frame and generating a wait indication signal of a first logic state to an outside when the access operation of the previous frame is determined to be performed in the step (B); and (D) performing a burst access operation in which a burst address for selecting a column of the DRAM array is varied in synchronization with an external clock signal when the access operation of the previous frame is determined to be completed in the step (B);

wherein the access operation of the previous frame includes a write access operation or a refresh operation generated before the effective address signal of the current frame is activated.

9. The method as set forth in claim 8, further comprising providing the wait indication signal of the first logic state while an operation of a column latency is performed.

10. The method as set forth in claim 8, further comprising performing the burst access operation when it is determined that the access operation of the previous frame is not performed in the step (B).

11. The method as set forth in claim 8, further comprising rendering the synchronous SRAM-compatible memory entered in an idle state when the burst access operation is completed.

12. The method as set forth in claim 8, further comprising:

activating a refresh request signal that requests a refresh operation with respect to the DRAM array at selected intervals; and performing the refresh operation after completion of the burst access operation when the refresh request signal is activated during the burst access operation.

13. The method as set forth in claim 8, further comprising:

receiving input data provided from an outside in synchronization with the external clock signal;

storing the received input data in an internally installed buffer; and writing the received input data stored in the buffer in the DRAM array, the writing of the received input data being delayed till completion of an access operation of a previous frame while the access operation of the previous frame is performed.

14. The method as set forth in claim 13, wherein the writing of the received input data is performed in a same order of the storing of the received input data in the buffer.

* * * * *